US011039050B2

(12) United States Patent
Yeh et al.

(10) Patent No.: US 11,039,050 B2
(45) Date of Patent: Jun. 15, 2021

(54) SPIRAL FLEXIBLE BOARD AND MONITORING CAMERA APPARATUS

(71) Applicant: VIVOTEK INC., New Taipei (TW)

(72) Inventors: Chien-Ming Yeh, New Taipei (TW); Hsin-Chin Chen, New Taipei (TW)

(73) Assignee: VIVOTEK INC., New Taipei (TW)

( * ) Notice: Subject to any disclaimer, the term of this patent is extended or adjusted under 35 U.S.C. 154(b) by 0 days.

(21) Appl. No.: 16/821,991

(22) Filed: Mar. 17, 2020

(65) Prior Publication Data

US 2020/0329179 A1 Oct. 15, 2020

(30) Foreign Application Priority Data

Apr. 15, 2019 (TW) .................. 108112989

(51) Int. Cl.
| | |
|---|---|
| *H04N 5/225* | (2006.01) |
| *H04N 5/232* | (2006.01) |
| *H04N 7/18* | (2006.01) |
| *H05K 1/02* | (2006.01) |
| *H05K 1/14* | (2006.01) |
| *H05K 1/18* | (2006.01) |

(52) U.S. Cl.
CPC ......... *H04N 5/2253* (2013.01); *H04N 5/2251* (2013.01); *H04N 5/23299* (2018.08); *H04N 7/18* (2013.01); *H05K 1/0277* (2013.01); *H05K 1/144* (2013.01); *H05K 1/147* (2013.01); *H05K 1/181* (2013.01); *H05K 2201/042* (2013.01); *H05K 2201/10151* (2013.01)

(58) Field of Classification Search
CPC ........... G08B 13/19617; H04N 5/2251; H04N 5/2253; H04N 5/23299; H04N 7/18; H04N 7/183; H05K 1/0277; H05K 1/028; H05K 1/144; H05K 1/147; H05K 1/181; H05K 2201/042; H05K 2201/051; H05K 2201/09063; H05K 2201/10151
See application file for complete search history.

(56) References Cited

U.S. PATENT DOCUMENTS

| | | | | |
|---|---|---|---|---|
| 2006/0132631 A1* | 6/2006 | Yoshii | ................ | H04N 5/23248 348/294 |
| 2007/0189744 A1* | 8/2007 | Huang | ................ | H04N 5/2253 396/55 |

FOREIGN PATENT DOCUMENTS

DE 4301603 A1 * 1/1994 ............... G01K 1/14

\* cited by examiner

*Primary Examiner* — Peet Dhillon
(74) *Attorney, Agent, or Firm* — Winston Hsu

(57) ABSTRACT

A monitoring camera apparatus includes a main circuit board, a sensing circuit board, an adjusting mechanism and a spiral flexible board. The main circuit board includes an image processor. The sensing circuit board includes an image sensor. The adjusting mechanism is connected to the sensing circuit board for adjusting position of the sensing circuit board and/or a lens of the monitoring camera apparatus, so as to vary a rotary angle and an inclined angle of the sensing circuit board relative to the main circuit board. The spiral flexible board has a first end and a second end opposite to each other. The first end and the second end are respectively connected to the main circuit board and the sensing circuit board, so that image information acquired by the image sensor can be transmitted to the image processor via the spiral flexible board.

13 Claims, 9 Drawing Sheets

SPIRAL FLEXIBLE BOARD AND MONITORING CAMERA APPARATUS

BACKGROUND OF THE INVENTION

1. Field of the Invention

The present invention relates to a spiral flexible board and a monitoring camera apparatus, and more particularly, to a spiral flexible board and a monitoring camera apparatus utilizing the spiral flexible board to execute high speed signal transmission.

2. Description of the Prior Art

A conventional monitoring camera apparatus utilizes the adjusting mechanism to shift and rotate the lens for varying the rotary angle and the inclined angle. The monitoring camera apparatus has the main circuit board disposed on the base, and further has the sensing circuit board disposed on the lens. The lens can be moved and rotated relative to the base. The coaxial cable is connected between the main circuit board and the sensing circuit board for high speed signal transmission. The coaxial cable is expensive and regularly shaken inside the casing of the monitoring camera apparatus when the lens is rotated, which results in damage and abrasion of the coaxial cable, even other signal transmission cable being pulled by the coaxial cable and impaired. Therefore, design of a monitoring camera apparatus without drawbacks of high manufacturing cost and high failure rate resulted from the coaxial cable is an important issue in the related mechanical design industry.

SUMMARY OF THE INVENTION

The present invention provides a spiral flexible board and a monitoring camera apparatus utilizing the spiral flexible board to execute high speed signal transmission for solving above drawbacks.

According to the claimed invention, a monitoring camera apparatus includes a main circuit board, a sensing circuit board, an adjusting mechanism and a spiral flexible board. The main circuit board has an image processor. The sensing circuit board has an image sensor adapted to acquire image information. The adjusting mechanism is connected to the sensing circuit board and adapted to adjust position of the sensing circuit board, so as to vary a rotary angle and an inclined angle of the sensing circuit board relative to the main circuit board. The spiral flexible board has a first end and a second end opposite to each other. The first end and the second end are electrically connected to the main circuit board and the sensing circuit board in a respective manner, so that the image information acquired by the image sensor is transmitted to the image processor via the spiral flexible board. The spiral flexible board comprises a plurality of curve-shaped sections connected with each other, parameters of each of the plurality of curve-shaped sections and an interval between two of the plurality of curve-shaped sections are varied in accordance with the rotary angle and the inclined angle.

The monitoring camera apparatus of the present invention can replace the coaxial cable with expensive cost by the flexible board, and the flexible board can be processed into the spiral flexible board via thermoplastic procedure or any similar ones in accordance with demands of rotating and shifting the lens of the monitoring camera apparatus. The main body of the spiral flexible board can optionally have the slot structure, and the ends of the main body can be cut as inclined portions for matching with placement angles of the main circuit board and the sensing circuit board. The spiral flexible board of the present invention can satisfy demands of high speed transmission and functions of rotating/shifting the lens for acquiring the image with the wide view, and further have advantages of low product cost, marshaling for the signal connection cable, and protect function against the electromagnetic interference.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
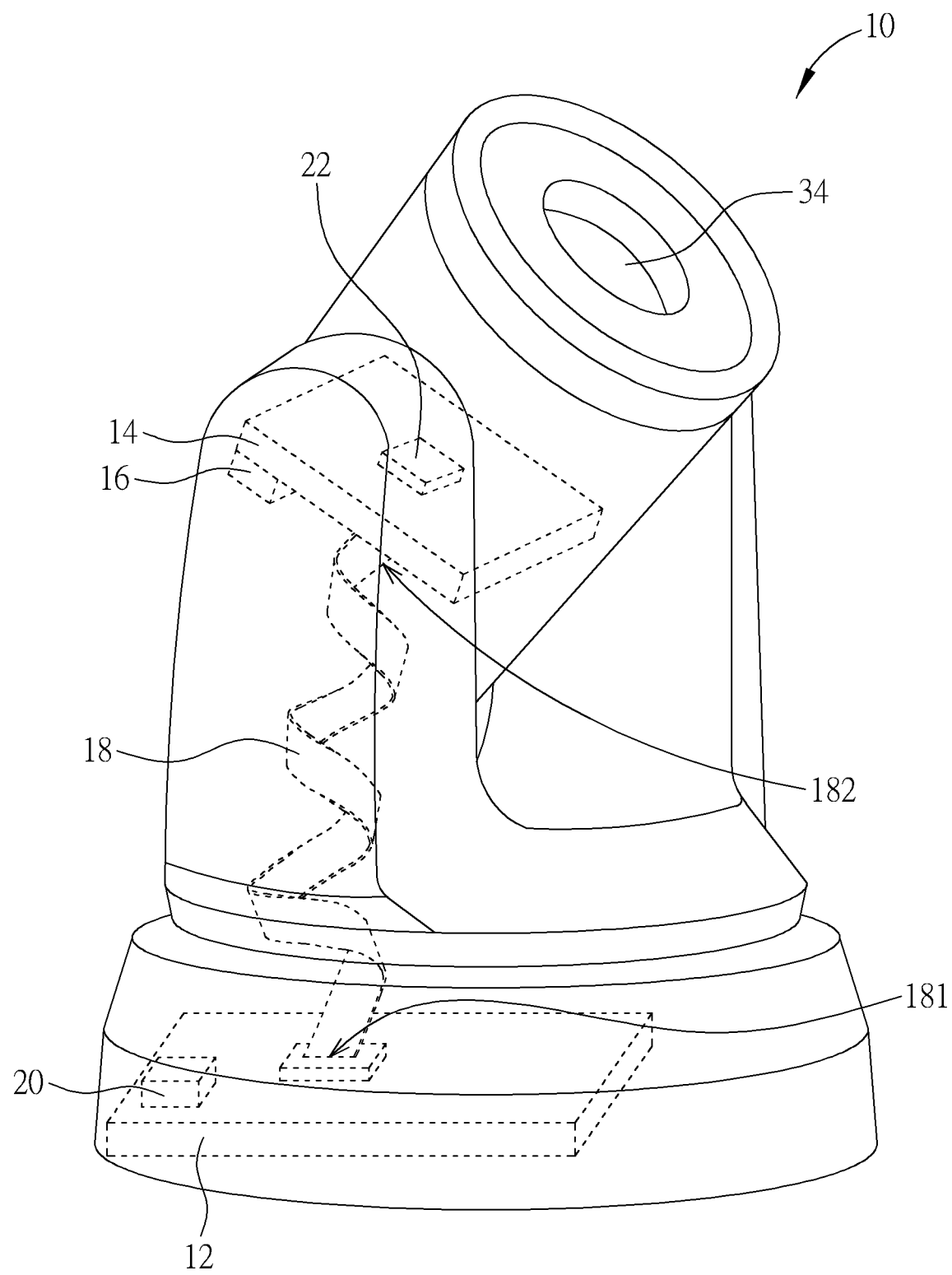
FIG. 1 is a diagram of a monitoring camera apparatus according to an embodiment of the present invention.
Figure 2:
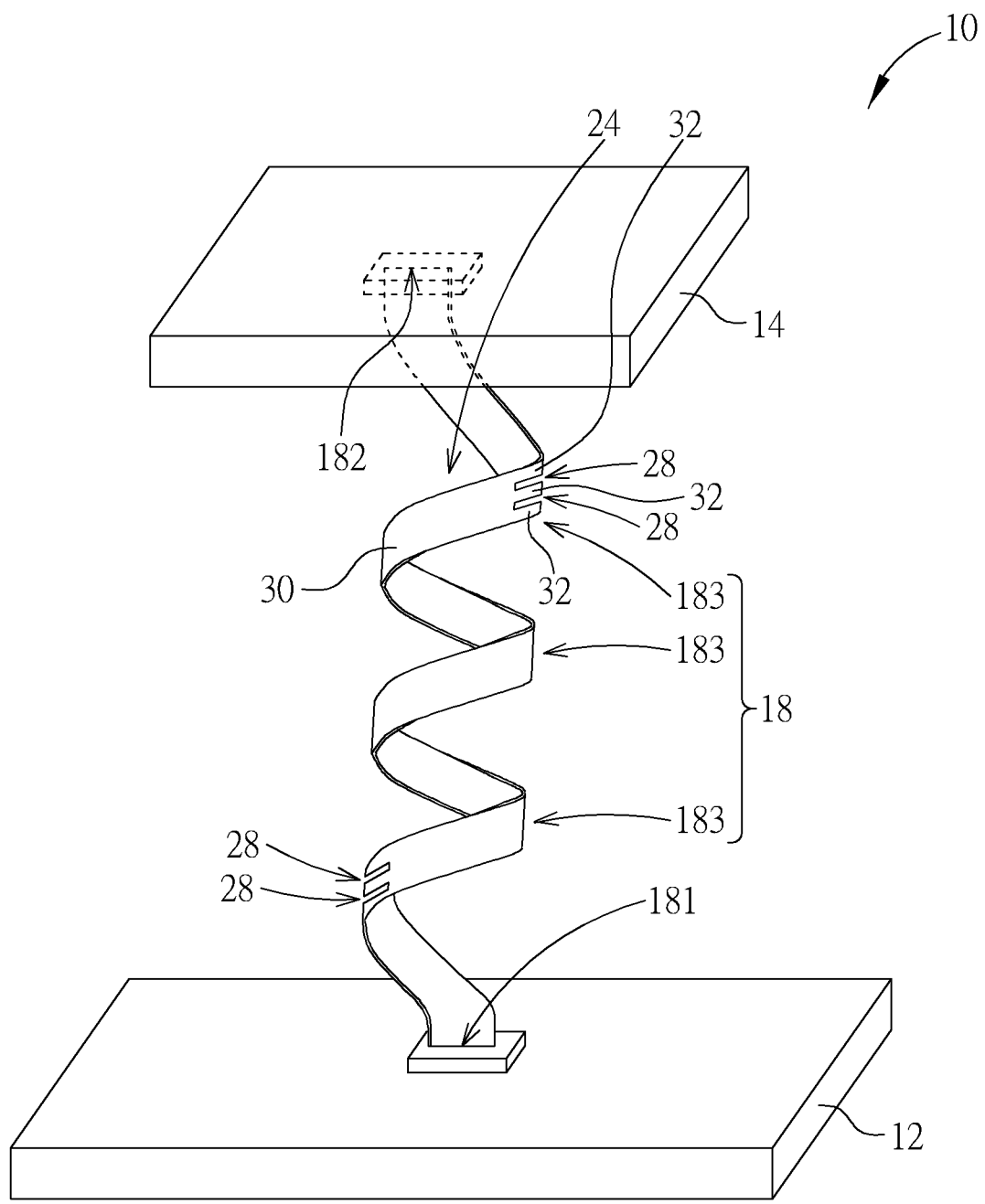
FIG. 2 to FIG. 4 are diagrams of inner structures of the monitoring camera apparatus in different operation modes according to the embodiment of the present invention.
Figure 3:
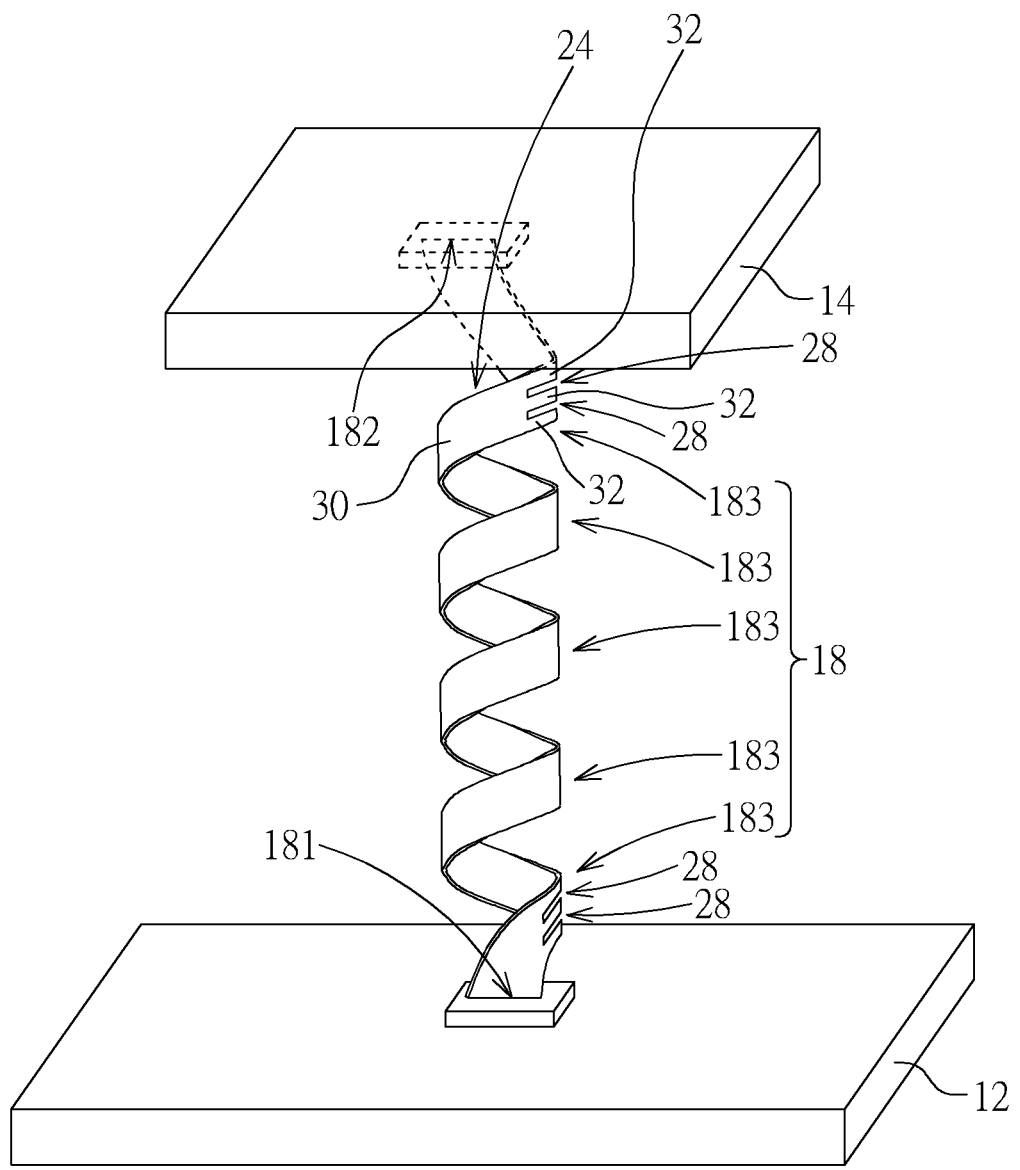
Figure 4:
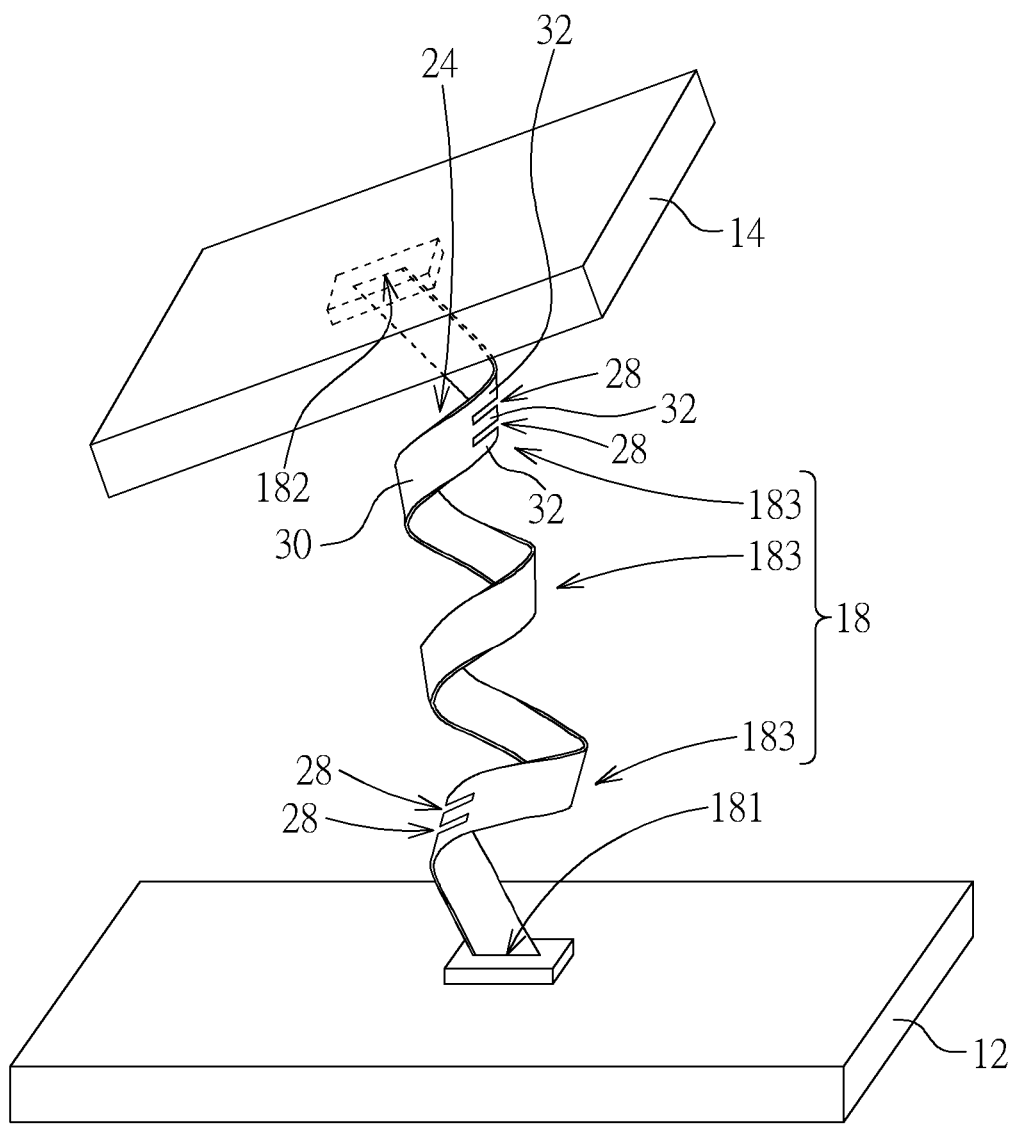

Please refer to FIG. 1 to FIG. 4. FIG. 1 is a diagram of a monitoring camera apparatus 10 according to an embodiment of the present invention. FIG. 2 to FIG. 4 are diagrams of inner structures of the monitoring camera apparatus 10 in different operation modes according to the embodiment of the present invention. The monitoring camera apparatus 10 can include a main circuit board 12, a sensing circuit board 14, an adjusting mechanism 16 and a spiral flexible board 18. A first end 181 and a second end 182 of the spiral flexible board 18 can be electrically connected to the main circuit board 12 and the sensing circuit board 14 in a respective manner, so that an image processor 20 of the main circuit board 12 can receive a monitoring image acquired by an image sensor 22 of the sensing circuit board 14. The adjusting mechanism 16 can be connected to the sensing circuit board 14 and used to adjust position of the sensing circuit board 14 and/or a lens 34 of the monitoring camera apparatus 10, so as to vary a rotary angle and an inclined angle of the sensing circuit board 14 relative to the main circuit board 12. In one possible embodiment, the sensing circuit board 14, the image sensor 22 and the lens 34 can be assembled as a lens module, so that the adjusting mechanism 16 can adjust position of the lens module for acquiring an image with wide view. In other possible embodiment, the sensing circuit board 14 and the lens 34 may be separated in different position.

Generally, a flexible board can be heated and pressed via thermoplastic procedure, and then be rolled up into a spiral type for forming the spiral flexible board 18; however, an actual application is not limited to the above-mentioned embodiment, and any procedure capable of molding the flat flexible board into the spiral flexible board 18 can be applied in the present invention. The spiral flexible board 18 can include a plurality of curve-shaped sections 183 connected with each other, and a hollow area 24 can be surrounded by the plurality of curve-shaped sections 183. Structural parameters of each curve-shaped section 183 and an interval between two adjacent curve-shaped sections 183 can be varied according to change of the rotary angle and the inclined angle. Due to flexibility of the plurality of curve-shaped sections 183, the monitoring camera apparatus 10 can allow large scale rotation and inclination of the sensing circuit board 14 relative to the main circuit board 12, without damage of the spiral flexible board 18. The present invention can increase a range of motion of the adjusting mechanism 16, and therefore the image sensor 22 of the sensing circuit board 14 can acquire image information with the wide view.

For example, if the sensing circuit board 14 is rotated in a clockwise direction, the plurality of curve-shaped sections 183 can have decreased level of bending, and the interval between any two adjacent curve-shaped sections 183 of the plurality of curve-shaped sections 183 can be increased, as shown in FIG. 2. If the sensing circuit board 14 is rotated in a counterclockwise direction, the plurality of curve-shaped sections 183 can have increased level of bending, and the interval between any two adjacent curve-shaped sections 183 of the plurality of curve-shaped sections 183 can be decreased, as shown in FIG. 3. If the sensing circuit board 14 is inclined relative to the main circuit board 12, the plurality of curve-shaped sections 183 may have the same level of bending, and a side interval between any two adjacent curve-shaped sections 183 of the plurality of curve-shaped sections 183 can be decreased, and the other side interval between any two adjacent curve-shaped sections 183 of the plurality of curve-shaped sections 183 can be increased, as shown in FIG. 4.

Figure 5:
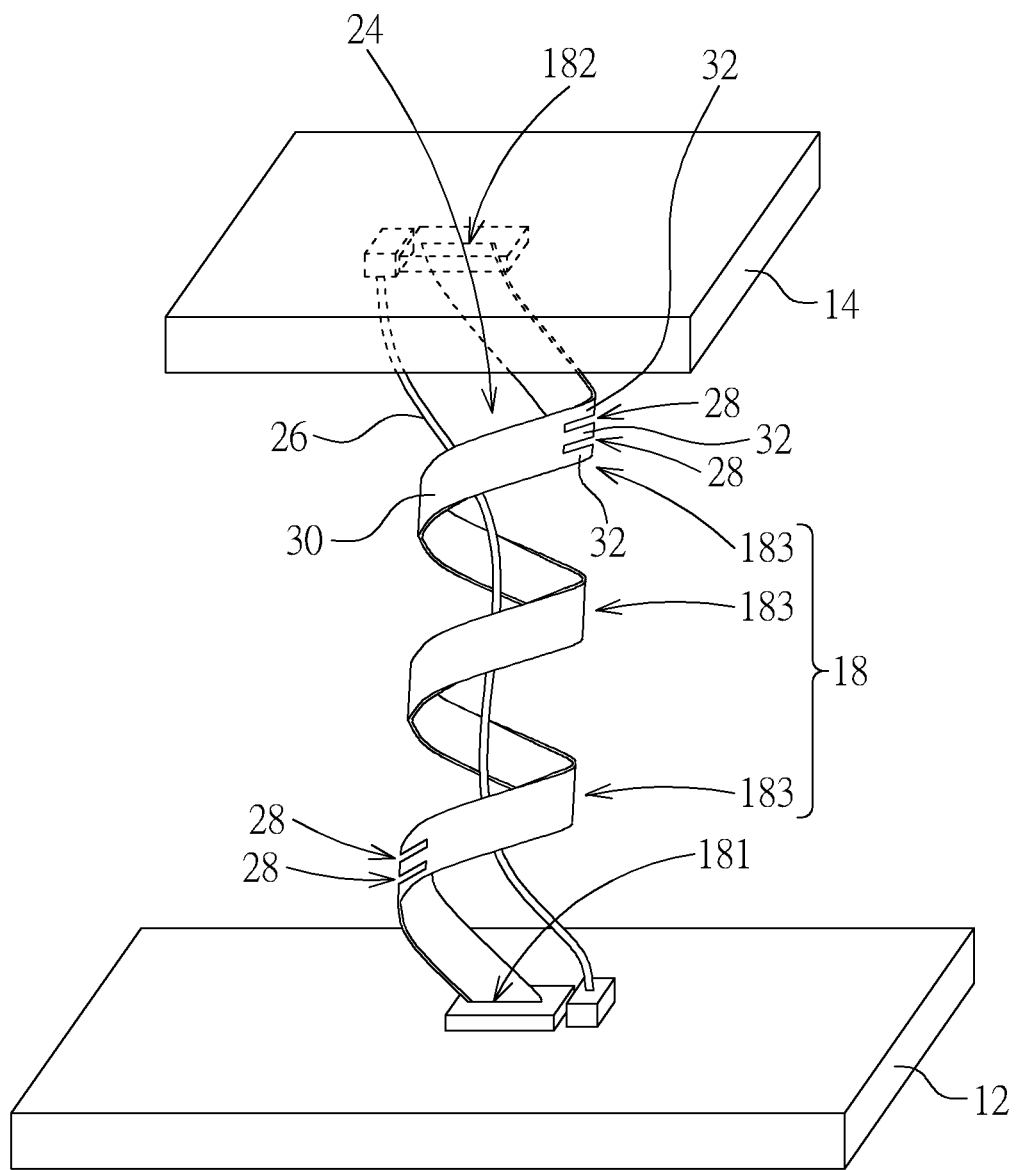
FIG. 5 is a diagram of inner structure of the monitoring camera apparatus according to another embodiment of the present invention.

Please refer to FIG. 5. FIG. 5 is a diagram of inner structure of the monitoring camera apparatus 10 according to another embodiment of the present invention. The monitoring camera apparatus 10 can further include a signal connection cable 26, and two ends of the signal connection cable 26 are electrically connected to the main circuit board 12 and the sensing circuit board 14 in a respective manner. The signal connection cable 26 preferably can be located inside the hollow area 26, which means the signal connection cable 26 can be marshaled to get together by the spiral flexible board 18. In addition, any surface (including one surface facing the hollow area 26 and the other surface opposite to the hollow area 26) of the spiral flexible board 18 can be coated by insulation material, electromagnetic shielded material, anti static material and/or related composite material. The signal connection cable 26 inside the hollow area 26 can be effectively protected by the spiral flexible board 18 against electromagnetic interference.

Figure 6:
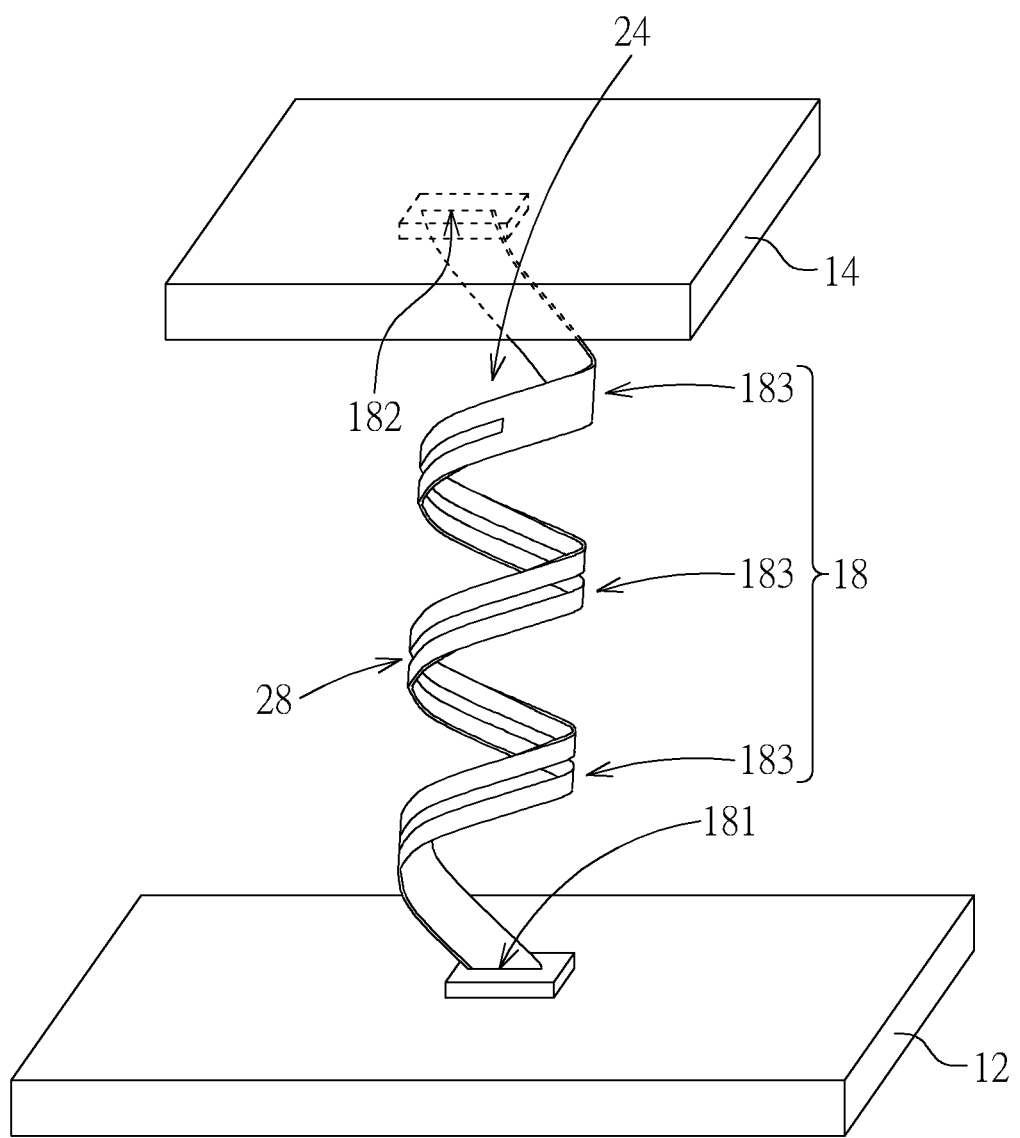
FIG. 6 and FIG. 7 are diagrams of the monitoring camera apparatus according to other embodiments of the present invention.
Figure 7:
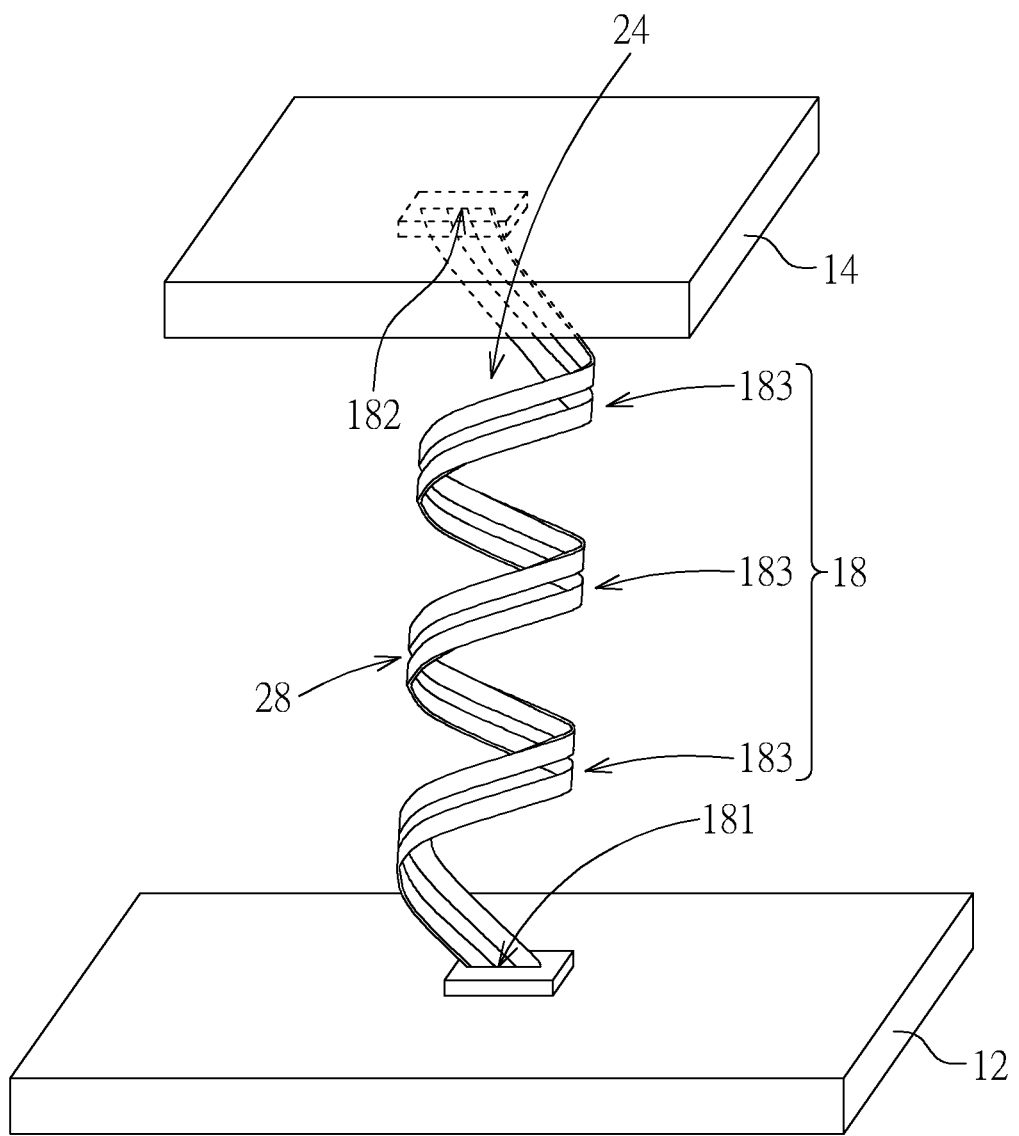

As shown in FIG. 2, the spiral flexible board 18 can have a slot structure 28 formed on a main body 30 of the spiral flexible board 18. An amount and position of the slot structure 28 are not limited to the above-mentioned embodiment, and depend on design demand. The slot structure 28 can be formed on position of the main body 30 adjacent to the first end 181 and/or the second end 182, so that the spiral flexible board 18 can provide preferred flexibility in response to rotation and inclination. Please refer to FIG. 6 and FIG. 7. FIG. 6 and FIG. 7 are diagrams of the monitoring camera apparatus 10 according to other embodiments of the present invention. As shown in FIG. 6, the slot structure 28 can be disposed on position between the first end 181 and the second end 182; as shown in FIG. 7, the slot structure 28 can be stretched from the first end 181 directly to the second end 182.

Figure 8:
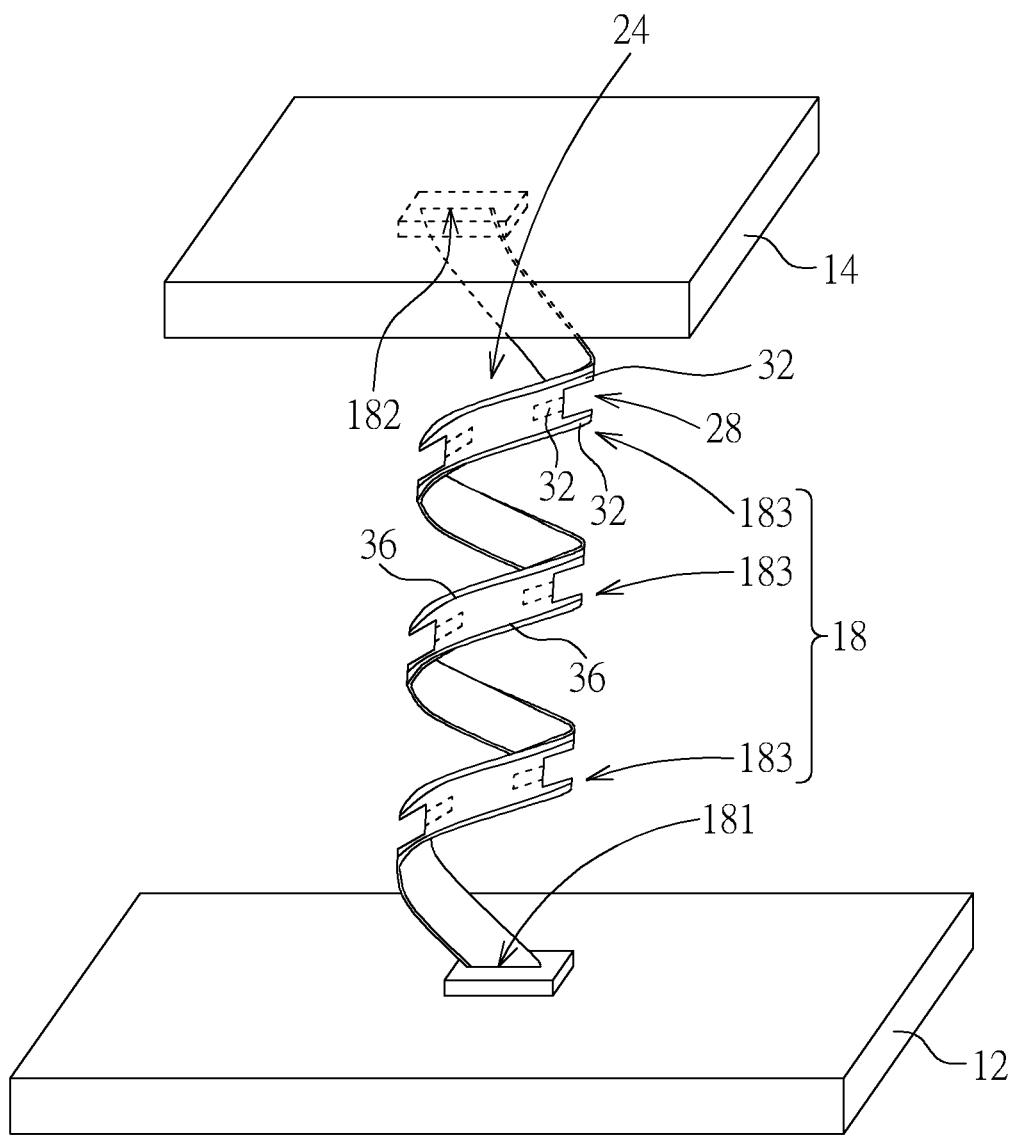
FIG. 8 is a diagram of the monitoring camera apparatus according to another embodiment of the present invention.

Please refer to FIG. 2 and FIG. 8. FIG. 8 is a diagram of the monitoring camera apparatus 10 according to another embodiment of the present invention. The main body 30 of the spiral flexible board 18 can have a plurality of strip-shaped sections 32. Two opposite sides of each slot structure 28 can form two strip-shaped sections 32, and two adjacent slot structures 28 can provide three strip-shaped sections 32 accordingly. The slot structure 28 can be an empty area on the main body 30, and a plurality of transmission cables 36 of the spiral flexible board 18 can be respectively disposed along the plurality of strip-shaped sections 32, and stretched from the first end 181 to the second end 182 for connecting the main circuit board 12 with the sensing circuit board 14. The plurality of transmission cables 36 can transmit the image information acquired by the image sensor 22 to the image processor 20. As the embodiment shown in FIG. 2, the plurality of strip-shaped sections 32 can have the same bending direction; for example, all the strip-shaped sections 32 are bent outward. As the embodiment shown in FIG. 8, the plurality of strip-shaped sections 32 may have several bending directions; for example, the two outside strip-shaped sections 32 are bent outward, and the one middle strip-shaped section 32 is bent inward.

Figure 9:
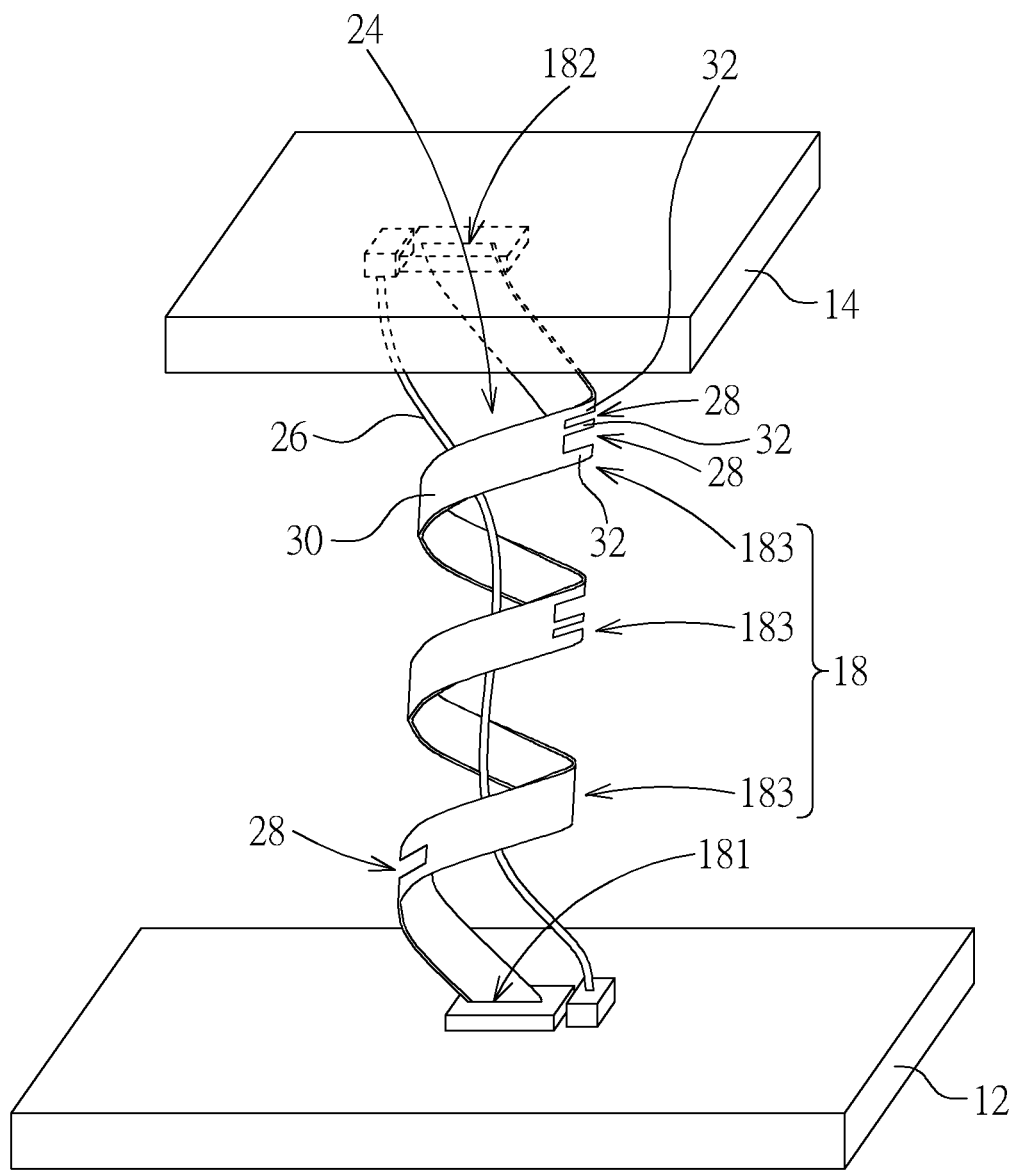
FIG. 9 is a diagram of inner structure of the monitoring camera apparatus according to another embodiment of the present invention.

As the embodiments shown in FIG. 2, FIG. 6 and FIG. 7, the slot structure 28 can be, but not limited to, a straight-type form. The slot structure 28 further can be designed as a curve-type form, or a combination of the straight-type form and the curve-type form. For satisfying a variety of design demands and efficacy, a shape of the slot structure 28 can be adjusted in accordance with a user's demand. Please refer to FIG. 9. FIG. 9 is a diagram of inner structure of the monitoring camera apparatus 10 according to another embodiment of the present invention. As an example shown in FIG. 9, some of the slot structures 28 with the straight-type form may have different widths; for example, a width of the slot structure 28 close to the first end 181 may be different from a width of the slot structure 28 close to the second end 182, or a width of the slot structure 28 in one curve-shaped section 183 may be different from a width of the slot structure 28 in another curve-shaped section 183. Variation of the width of the slot structure 28 is not limited to the above-mentioned embodiments, which depends on the design demand. The slot structure 28 can improve the flexibility and rotatable possibility of the spiral flexible board 18, so that any structure capable of increasing the rotatable possibility and ductility of the spiral flexible board 18 belongs to a scope of the slot structure 28 in the present invention.

It should be mentioned that two ends of the spiral flexible board 18 can be cut optionally and show specific shapes for matching with the main circuit board 12 and the sensing circuit board 14. As the embodiment shown in FIG. 2, the first end 181 and the second end 182 of the spiral flexible board 18 may be uncut, which means angles between the first end 181 and laterals sides of the spiral flexible board 18, and angles between the second end 182 and the laterals sides of the spiral flexible board 18 may be right angles. In response to the rolling-up spiral type of the spiral flexible board 18, the two ends of the spiral flexible board 18 can be optionally cut for aligning with the main circuit board 12 and the sensing circuit board 14, such as the embodiment shown in FIG. 8; the angles between the first end 181 and the two laterals sides of the spiral flexible board 18 can respectively be an acute angle and an obtuse angle, or a related combination, and the angles between the second end 182 and the two laterals sides of the spiral flexible board 18 can respectively be the acute angle and the obtuse angle, or the related combination. The cutting shapes of the first end 181 and the second end 182 of the spiral flexible board 18 are not limited to the above-mentioned embodiments, and the angles between one end and the laterals sides of the spiral flexible board 18 may be the acute angles, or the obtuse angles.

In conclusion, the monitoring camera apparatus of the present invention can replace the coaxial cable with expensive cost by the flexible board, and the flexible board can be processed into the spiral flexible board via thermoplastic procedure or any similar ones in accordance with demands of rotating and shifting the lens of the monitoring camera apparatus. The main body of the spiral flexible board can optionally have the slot structure, and the ends of the main body can be cut as inclined portions for matching with placement angles of the main circuit board and the sensing circuit board. Comparing to the prior art, the spiral flexible board of the present invention can satisfy demands of high speed transmission and functions of rotating/shifting the lens for acquiring the image with the wide view, and further have advantages of low product cost, marshaling for the signal connection cable, and protect function against the electromagnetic interference.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A monitoring camera apparatus comprising:
   a main circuit board, having an image processor;
   a sensing circuit board, having an image sensor adapted to acquire image information;
   an adjusting mechanism connected to the sensing circuit board and adapted to adjust position of the sensing circuit board, so as to vary a rotary angle and an inclined angle of the sensing circuit board relative to the main circuit board; and
   a spiral flexible board, having a first end and a second end opposite to each other, the first end and the second end being electrically connected to the main circuit board and the sensing circuit board in a respective manner, so that the image information acquired by the image sensor is transmitted to the image processor via the spiral flexible board;
   wherein the spiral flexible board comprises a plurality of curve-shaped sections connected with each other, parameters of each of the plurality of curve-shaped sections and an interval between two of the plurality of curve-shaped sections are varied in accordance with the rotary angle and the inclined angle.

2. The monitoring camera apparatus of claim 1, wherein the spiral flexible board comprises at least one slot structure formed on a main body of the spiral flexible board.

3. The monitoring camera apparatus of claim 2, wherein the at least one slot structure is disposed on position of the main body adjacent to the first end and/or the second end.

4. The monitoring camera apparatus of claim 2, wherein the at least one slot structure is disposed between the first end and the second end.

5. The monitoring camera apparatus of claim 2, wherein the at least one slot structure is disposed on the main body and stretched from the first end to the second end.

6. The monitoring camera apparatus of claim 2, wherein the at least one slot structure is a straight-type form, a curve-type form, or a combination of the straight-type form and the curve-type form.

7. The monitoring camera apparatus of claim 2, wherein the main body comprises at least two strip-shaped sections respectively located at two opposite sides of the at least one slot structure, a plurality of transmission cables of the spiral flexible board is disposed along the at least two strip-shaped sections, and the image information acquired by the image sensor is transmitted to the image processor via the plurality of transmission cables.

8. The monitoring camera apparatus of claim 7, wherein bending directions of the at least two strip-shaped sections are the same.

9. The monitoring camera apparatus of claim 7, wherein bending directions of the at least two strip-shaped sections are opposite.

10. The monitoring camera apparatus of claim 1, further comprising:
   at least one signal connection cable located at a hollow area surrounded by the plurality of curve-shaped sections of the spiral flexible board, two ends of the at least one signal connection cable being electrically connected to the main circuit board and the sensing circuit board in a respective manner.

11. The monitoring camera apparatus of claim 1, wherein angles between one of the first end and the second end of the spiral flexible board and two lateral sides of the spiral flexible board, and angles between the other end and the two lateral sides of the spiral flexible board, are an acute angle and an obtuse angle, or a combination of the acute angle and/or the obtuse angle.

12. The monitoring camera apparatus of claim 10, wherein a surface of the spiral flexible board is coated by insulation material, electromagnetic shielded material, antistatic material or related composite material, the hollow area surrounded by the plurality of curve-shaped sections provides protect function against electromagnetic interference.

13. The monitoring camera apparatus of claim 1, wherein the spiral flexible board utilizes thermoplastic procedure to manufacture the plurality of curve-shaped sections, so as to roll up a flexible board into a spiral type.

* * * * *